United States Patent
Liang

(10) Patent No.: US 12,231,141 B2
(45) Date of Patent: Feb. 18, 2025

(54) ANALOG-TO-DIGITAL CONVERTER, SIGNAL CONVERSION DEVICE, AND SIGNAL CONVERSION METHOD

(71) Applicant: GIGADEVICE SEMICONDUCTOR INC., Beijing (CN)

(72) Inventor: Sheng Liang, Beijing (CN)

(73) Assignee: GIGADEVICE SEMICONDUCTOR INC., Beijing (CN)

( * ) Notice: Subject to any disclaimer, the term of this patent is extended or adjusted under 35 U.S.C. 154(b) by 177 days.

(21) Appl. No.: 18/186,181

(22) Filed: Mar. 19, 2023

(65) Prior Publication Data
US 2024/0128980 A1    Apr. 18, 2024

(30) Foreign Application Priority Data
Oct. 14, 2022    (CN) .......................... 202211259868.4

(51) Int. Cl.
*H03M 1/12*    (2006.01)

(52) U.S. Cl.
CPC ....... *H03M 1/1245* (2013.01); *H03M 1/1205* (2013.01)

(58) Field of Classification Search
CPC .... H03M 1/12; H03M 1/1245; H03M 1/1205; H03M 1/1225
See application file for complete search history.

(56) References Cited

U.S. PATENT DOCUMENTS

| | | | | |
|---|---|---|---|---|
| 6,313,772 B1* | 11/2001 | McNeely | ................ | H04L 27/02 348/724 |
| 10,727,855 B2* | 7/2020 | Sugiyama | ........... | H03M 1/1245 |
| 10,826,518 B2* | 11/2020 | Shiihara | ............... | G05B 19/054 |
| 2010/0245143 A1* | 9/2010 | Stanley | ............... | H03M 1/1225 341/155 |
| 2014/0207979 A1* | 7/2014 | Wu | ......................... | G06F 13/28 710/22 |
| 2024/0088908 A1* | 3/2024 | Wu | ..................... | H03M 1/1225 |

* cited by examiner

*Primary Examiner* — Lam T Mai
(74) *Attorney, Agent, or Firm* — PV IP PC; Wei Te Chung

(57) ABSTRACT

Disclosure regards a signal conversion device and method and an analog-to-digital converter, including a channel module including a plurality of sampling channels, wherein each of the plurality of sampling channels is configured to receive an analog signal; a timing-control module configured to provide a plurality of candidate sequences including a first sequence and a second sequence for the same sampling channel, wherein the timing-control module sets a first sampling time corresponding to the first sequence and a second sampling time corresponding to the second sequence; a conversion module electrically coupled to the timing-control module and the channel module, wherein the conversion module is configured to convert the analog signal from the same sampling channel into a digital signal in response to an order and sampling times defined by the candidate sequences. Therefore, problems of poor sampling accuracy and flexibility in the current sampling technologies are effectively solved.

20 Claims, 4 Drawing Sheets

| Bits | Field |
|---|---|
| 18:9 | C[9:0] |
| 8:4 | B[4:0] |
| 3:0 | A[3:0] |

FIG. 3a

| 31 30 29 28 27 26 25 24 23 22 21 20 19 | 18 17 16 15 14 13 12 11 10 9 | 8 7 6 5 4 | 3 2 1 0 |
|---|---|---|---|
| RSV | C0[9:0] | B0[4:0] | A0[3:0] |

FIG. 3b

| 15 | 14 13 12 11 10 9 8 7 6 5 | 4 3 2 1 0 |
|---|---|---|
| RSV | C1[9:0] | B1[4:0] |

| 31 | 30 29 28 27 26 25 24 23 22 21 | 20 19 18 17 16 |
|---|---|---|
| RSV | C2[9:0] | B2[4:0] |

FIG. 3c

ANALOG-TO-DIGITAL CONVERTER, SIGNAL CONVERSION DEVICE, AND SIGNAL CONVERSION METHOD

CROSS REFERENCE TO RELATED APPLICATIONS

This application claims the priority of China Patent Application No. 202211259868.4, titled as "ANALOG-TO-DIGITAL CONVERTER, SIGNAL CONVERSION DEVICE, AND SIGNAL CONVERSION METHOD", filed on Oct. 14, 2022, the disclosure of which are incorporated herein by reference.

FIELD OF THE INVENTION

The present disclosure relates to the field of signal conversion technologies, and more particularly, to an analog-to-digital converter, a signal conversion device, and a signal conversion method.

BACKGROUND OF THE INVENTION

In electronic control devices, analog-to-digital conversion is a common signal conversion function, such as converting analog signals output by sensors into digital signals, such that a controller can perform related control functions based on the digital signals.

For example, an analog-to-digital converter (ADC) usually has multiple sampling channels for acquiring analog signals that are sequentially converted into digital signals through multiple sampling channels.

Some sampling technologies exist in the prior art, e.g., different sampling channels are independently configured with different sampling times. However, when a same analog signal is sampled, if a same sampling channel is used for sampling, different sampling times cannot be flexibly configured according to a waveform of an analog signal; if the analog signal is sampled using a configuration of multiple sampling channels, different sampling times can be configured, but its sampling accuracy is not as good as that using the same sampling channel. Therefore, the sampling technologies in the prior art still need to be improved.

SUMMARY OF THE INVENTION

One aspect of the present disclosure provides an analog-to-digital converter, which includes: a channel module including a plurality of sampling channels, wherein each of the plurality of sampling channels is configured to receive an analog signal; a timing-control module configured to provide a plurality of candidate sequences for a same sampling channel among the plurality of sampling channels, the plurality of candidate sequences include a first sequence and a second sequence, and the timing-control module sets a first sampling time corresponding to the first sequence and sets a second sampling time corresponding to the second sequence; and a conversion module electrically coupled to the timing-control module and the channel module, wherein the conversion module is configured to convert the analog signal from the same sampling channel into a digital signal in response to an order and sampling times that are defined by the plurality of candidate sequences.

Another aspect of the present disclosure provides a signal conversion device, which includes: a controller and the analog-to-digital converter mentioned above, wherein the controller is electrically coupled to the analog-to-digital converter.

Another aspect of the present disclosure provides a signal conversion method, which includes: driving, by a processor executing instructions stored in a memory electrically coupled to the processor, the analog-to-digital converter including a channel module, a timing-control module, and a conversion module electrically coupled to the timing-control module and the channel module, to be configured for: receiving, by the channel module, an analog signal from each of a plurality of sampling channels; providing, by the timing-control module, a plurality of candidate sequences for a same sampling channel among the plurality of sampling channels, wherein the plurality of candidate sequences comprise a first sequence and a second sequence, and the timing-control module sets a first sampling time corresponding to the first sequence and a second sampling time corresponding to the second sequence; and converting, by the conversion module, the analog signal from the same sampling channel to a digital signal in response to an order and sampling times defined by the plurality of candidate sequences.

BRIEF DESCRIPTION OF THE DRAWINGS

In order to clearly illustrate technical solutions in embodiments of the present disclosure, drawings that need to be used in the description of the embodiments will be briefly introduced below. Obviously, the drawings in the following description are only some embodiments of the present disclosure. For those ordinarily skilled in the art, other drawings can also be obtained based on these drawings without any creative effort.

FIG. 3a is a schematic diagram illustrating fields in a sequence according to an embodiment of the present disclosure.

FIG. 3b is another schematic diagram illustrating fields in a sequence according to an embodiment of the present disclosure.

FIG. 3c is still another schematic diagram illustrating fields in a sequence according to an embodiment of the present disclosure.

THE DETAILED DESCRIPTION OF PREFERRED EMBODIMENTS

Figure 1:
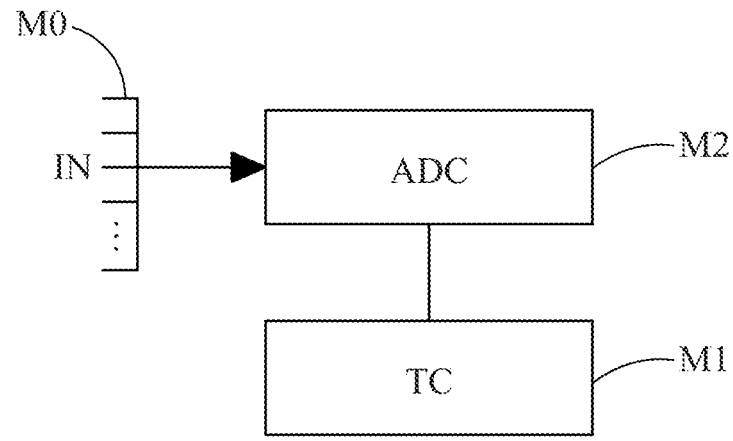
FIG. 1 is a schematic block diagram illustrating an analog-to-digital converter according to an embodiment of the present disclosure.

The technical solutions in the embodiments of the present disclosure will be clearly and completely described as follows with reference to the drawings in the embodiments of the present disclosure. Apparently, the described embodiments are only a part of the embodiments of the present disclosure, but not all of them. Based on the embodiments of the present disclosure, all other embodiments obtained by those ordinarily skilled in the art without creative efforts falls within the protection scope of the present disclosure.

In the description herein, it should be understood that an orientation or positional relationship indicated by the terms such as "center," "longitudinal," "transverse," "length," "width," "thickness," "upper," "lower," "front," "rear," "left," "right," "vertical," "horizontal," "top," "bottom," "inside," "outside," "clockwise," and "counterclockwise" is based on the orientation or positional relationship shown in the drawings and is only for the convenience of describing the present disclosure and simplifying the description, rather than indicating or implying that a referred device or element has a specific orientation or is constructed and operates in a specific orientation. Therefore it should not be construed as a limitation of the present disclosure.

In the description herein, it should be understood that the terms "first" and "second" are merely used for descriptive purposes and cannot be interpreted as indicating or implying relative importance or implicitly specifying a quantity of indicated technical features. In this way, features defined as "first" or "second" may explicitly or implicitly include one or more of said features. In the description of the present disclosure, "plurality" means two or more, unless otherwise specifically defined.

Many different embodiments or examples are provided herein for implementing different configurations of the present disclosure. To simplify the content of the present disclosure, components and arrangements of specific examples are described below. Certainly, they are examples only and are not intended to limit the present disclosure. In addition, the present disclosure may repeat reference numerals and/or reference letters in different examples; such repetition is used for simplicity and clarity and does not indicate a relationship between the various embodiments and/or arrangements discussed. Furthermore, examples of various specific processes and materials are provided herein. Still, those ordinarily skilled in the art may recognize the application of other processes and/or the use of other materials.

Embodiments of the present disclosure provide an analog-to-digital converter, a signal conversion device, and a signal conversion method. Examples are given below, and relevant descriptions are used to enable those ordinarily skilled in the art to understand the present disclosure but are not intended to limit the present disclosure.

In one aspect, an embodiment of the present disclosure provides an analog-to-digital converter, which can be used to perform signal conversion operations such as converting an analog signal from a same sampling channel into a digital signal in response to sample times of different sequences for flexible configuration.

Herein, only a single-period sine wave signal is used as an example for related description, but is not limited to the description here; related descriptions are also applicable to other analog signals, such as triangular waves, saw-tooth waves, or irregular waves.

It should be understood that the "sequence" in the present disclosure represents a control order of analog-to-digital conversion, wherein each sequence may include relevant information about an analog-to-digital conversion mode, such as a sequence length, a sampling channel, and a sampling time, but is not limited to the description here. The following examples illustrate an analog-to-digital converter provided by an embodiment of the present disclosure.

Figure 2:
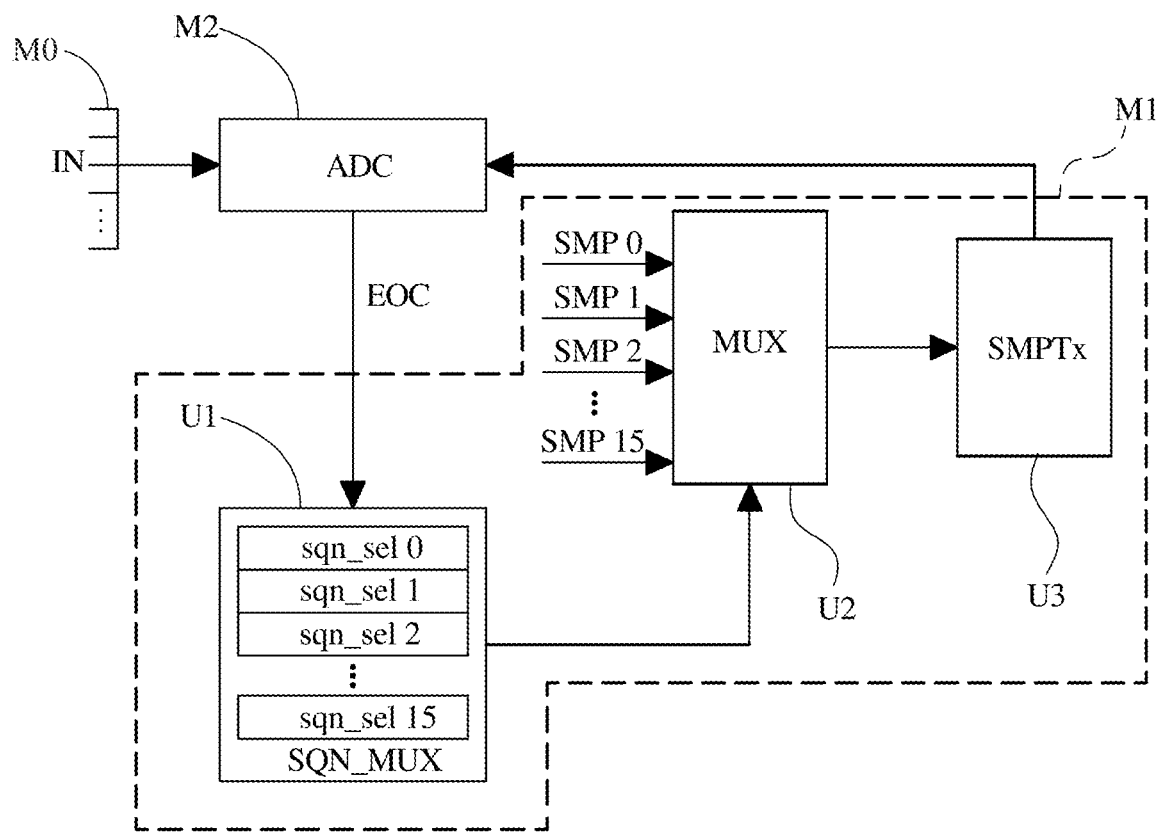
FIG. 2 is a schematic block diagram illustrating a circuit of an analog-to-digital converter according to an embodiment of the present disclosure.

For example, in one embodiment, as shown in FIGS. 1 and 2, the analog-to-digital converter includes a channel module M0, a timing-control module (TC) M1, and a conversion module (ADC) M2. The channel module M0 includes a plurality of sampling channels, wherein each of the plurality of sampling channels is configured to receive an analog signal IN. It should be noted that each sampling channel of the channel module M0 can receive one analog signal IN. In one embodiment, the analog signal IN of which sampling channel can be controlled by a channel selection switch (not shown in the figure) to be inputted to the conversion module M2 for analog-to-digital conversion. The form of the timing-control module M1 can be an application-specific integrated circuit (ASIC), the timing-control module M1 can be configured to provide a plurality of candidate sequences for a same sampling channel among the plurality of sampling channels, and the plurality of candidate sequences include a first sequence and a second sequence. The timing-control module M1 sets a first sampling time corresponding to the first sequence and a second sampling time corresponding to the second sequence. The conversion module M2 can be a circuit module with an analog-to-digital conversion function, wherein the conversion module M2 is electrically coupled to the timing-control module M1 and the channel module M0, and the conversion module M2 can be configured to convert the analog signal IN from the same sampling channel into a digital signal in response to an order and sampling times being defined by the plurality of sequences.

For example, as shown in FIGS. 1 and 2, the timing-control module M1 can be a circuit module capable of configuring multiple sampling times of sequences for the sampling channels. In an example, the timing-control module M1 can be implemented by a combinational logic circuit, which is used to sequentially output sampling times of n (e.g., n is equal to a value ranging from 2 to 16) sequences.

In an example, as shown in FIGS. 1 and 2, the timing-control module M1 includes a sequence setting unit U1 and a multiplexing unit U2.

In an example, as shown in FIGS. 1 and 2, the sequence setting unit U1 is electrically coupled to the conversion module M2. The sequence setting unit U1 is configured to sequentially select a plurality of candidate sequences, such as the candidate sequences sqn_sel0, sqn_sel1, sqn_sel2, . . . , and sqn_sel15, the order regarding the plurality of candidate sequences defines an order of operations in which the conversion module M2 converts the analog signal into the digital signal. Each of the plurality of candidate sequences corresponds to one of the plurality of sampling channels. In one example, each of the plurality of candidate sequences further corresponds to one of a plurality of candidate sampling times. For example, each of the plurality of candidate sequences can be independently configured with one sampling channel and one candidate sampling time used for the sampling channel, such as the candidate sampling times SMP0, SMP1, SMP2, . . . , and SMP15, e.g., the first sequence corresponds to the first sampling time, and the second sequence corresponds to the second sampling time, wherein the candidate sampling time is set to one of a plurality of time values, and a difference between adjacent two of the plurality of time values is one clock cycle. In an embodiment, the candidate sampling time can be set to k+1 clock cycles, k+2 clock cycles, . . . , or other numerical values that can be deduced in sequence and will not be described again. Because the candidate sampling time is set as one of continuous time periods, it is convenient to fine-tune the sampling time, and the flexibility and precision are better.

In an example, as shown in FIGS. 1 and 2, the sequence setting unit U1 can be formed as a multiplex sequence configuration (SQN_MUX). For example, the sequence setting unit U1 includes a sequence memory and a sequence multiplexing unit (not shown in the figures). The sequence memory is electrically coupled to the sequence multiplexing unit. The sequence memory can store the plurality of candidate sequences and can include a plurality of sequence registers. The sequence multiplex unit selects the plurality of candidate sequences (such as sqn_sel2 to sqn_sel6) from all sequences (such as sqn_sel0 to sqn_sel15), and then sequentially selects one of the plurality of candidate sequences (such as sqn_sel2~sqn_sel6). In one embodiment, the sequence setting unit U1 may further include a counting unit (not shown in the figures), wherein the counting unit controls which of the plurality of candidate sequences is sequentially output (e.g., when a count value is 1, sqn_sel2 is selected; when the count value is 2, sqn_sel3 is selected; . . . ; when the count value is 5, sqn_sel6 is selected, and the count value is reset to zero).

In an example, as shown in FIG. 3a, each of the plurality of candidate sequences has a corresponding sampling-channel register field (such as a field B[4:0]) and a corresponding sampling-time register field (such as a field C[9:0]), wherein the sampling-channel register field stores the sampling channel corresponding to each candidate sequence, and the sampling-time register field stores the sampling time corresponding to each candidate sequence. For example, the sequence memory may include m sequence registers, each of the sequence registers is used to store information on one or more of the plurality of candidate sequences. Indeed, the sequence register can also include other fields. For example, a first sequence register can also include a sequence length field (such as field A[3:0]) but is not limited to the description here. As shown in FIG. 3a, a 32-bit register is taken as an example, e.g., the 0th to 3rd bits of a first sequence register are formed as a sequence length field A[3:0], which stores a reference value (e.g., 0x0 to 0xF, i.e., 10'd0~10'd15) of the sequence length converted by the ADC, wherein the sequence length is a selected number of sequences, which can also be understood as several consecutive ADC conversions, e.g., a value of the sequence length field plus one (hereinafter expressed as A[3:0]+1) is the sequence length, such that the sequence length field that is 4 bits can set the sequence length to a maximum value of 16. It is worth taking note that the sequence length should be less than or equal to the number of sampling channels actually involved in the channel module M0 (e.g., the channel module M0 totally includes 18 sampling channels). As shown in FIG. 3b, the 0th to 3rd bits of the first sequence register are formed as the sequence length field A0[3:0]. The 4th to 8th bits of the first sequence register are formed as the sampling-channel register field B0[4:0], which stores a channel number corresponding to a candidate sequence "0" (18 sampling channels are taken as an example, such as one value among channel numbers 0 to 17; it is worth taking note that although a 5-bit sampling channel field can map up to 32 sampling channels, the channel module M0 actually include sampling channels in a quantity that can be less than or equal to 32, e.g., the channel module M0 totally includes 18 sampling channels, such that the channel numbers are 0 to 17). The 9th to 18th bits of the first sequence register are formed as the sampling-time register field C0[9:0], which stores the sampling time corresponding to the candidate sequence "0". The 19th to 31st bits of the sequence register can be formed as a reserved (RSV) field, but not limited to the description here. Please continue to refer to FIG. 3c, a 32-bits register is still taken as an example, the 0th to 4th bits of a second sequence register are formed as the sampling channel register fields B1[4:0], which store a channel number corresponding to a candidate sequence "1". The 5th to 14th bits of the second sequence register are formed as the sampling-time register field C1[9:0], which stores the sampling time corresponding to the candidate sequence "1". The 16th to 20th bits of the second sequence register are formed as the sampling-channel register field B2[4:0], which stores the channel number corresponding to a candidate sequence "2". The 21st to 30th bits of the second sequence register are formed as the sampling-time register field C2[9:0], which stores the sampling time corresponding to the candidate sequence "2". The 15th and 31st bits of the second sequence register can be formed as a reserved (RSV) field, but not limited to the description here. The forms of other sequence registers will not be described in detail again. It should be noted that, in one embodiment, one sequence register may include information on a plurality of candidate sequences (i.e., m is a number less than 16). In other embodiments, each candidate sequence can be provided with one sequence register (i.e., m is a number equal to 16). In summary, each candidate sequence has a corresponding sampling-channel register field and a corresponding sampling time register field, which are respectively used to configure and store the sampling channel and the sampling time corresponding to the candidate sequence.

In one example, the sequence length column A[3:0] can be, for example, one of numbers from 0 to 15, but not limited to the description here, and a range of numbers can be adjusted according to actual requirements, A[3:0]+1 is the sequence length, and the embodiment shown in FIG. 2 includes 16 candidate sequences, that is, the sequence length is at most 16. As shown in FIG. 3a, the sampling-channel register field B[4:0] can be, for example, a numerical value one of numbers from 0 to 31, but not limited to the description here, and a range of numbers can be adjusted according to actual requirements. For example, although a 5-bit sampling channel field can map up to 32 sampling channels, the number of the sampling channels included in the channel module M0 can be less than or equal to 32, such as including a total number of 18 or 20 sampling channels, at this time, the sampling-channel register field B[4:0] is ranged from 0 to 17 or from 0 to 19. The sampling-time register field C[9:0] can be one of numbers from 0 to 1023, but not limited to the description here, and a range of numbers can be adjusted according to actual requirements. For example, a decimal value 10'd0 can indicate that the sampling time is k clock cycles (such as a single clock cycle T=1/f, f is a system clock frequency), a decimal number 10'd1 can represent k+1 clock cycles, a decimal number 10'd2 can represent k+2 clock cycles, and so on, a decimal number 10'd639 can represent k+639 clock cycles, and the rest of the numbers can be deduced in sequence, and will not be repeated here. Accordingly, because the number of bits in the sampling-time register field is more, the candidate sampling time can be set as one of a plurality of time values, and a difference between any adjacent two of the time values is one clock period to fine-tune the candidate sampling time as the sampling time. But the description here is not limited; the number of fields, the number of digits, and positions of each candidate sequence can be adjusted according to actual requirements.

In one example, as shown in FIGS. 1 and 2, the multiplexing unit U2 can be, for example, the multiplexing circuit (MUX). The multiplexing unit U2 is electrically coupled to the sequence setting unit U1. The multiplexing unit U2 is configured to select one of a plurality of candidate sampling times to generate one of the sampling times according to one of the plurality of candidate sequences selected by the sequence setting unit U1. For example, a plurality of data input terminals of the multiplexing unit U2 can be mapped to the plurality of candidate sampling times (such as SMP0, SMP1, SMP2, . . . , and SMP15). A selection input terminal of the multiplexing unit U2 can be controlled by a sequence number (such as 0 to 15) of the candidate sequence that is selected from the plurality of candidate sequences (such as sqn_sel0, sqn_sel1, sqn_sel2, . . . , and sqn_sel15), such that a data output terminal of the multiplexing unit U2 can output the plurality of candidate sampling times (such as SMP0, SMP1, SMP2, . . . , and SMP15) as the sampling time according to the sequence numbers (such as 0 to 15). For example, if the first sequence (e.g., sqn_sel2) is selected, then a corresponding first sampling time (e.g., SMP2) is selected to generate one of the sampling times. If the second sequence (e.g., sqn_sel3) is selected, a corresponding second sampling time (e.g., SMP3) is selected to generate one of the sampling times. The first sampling time (e.g., SMP2) and the second sampling time (e.g., SMP3) can be different, but not limited to the description here. Because the first and the second sampling times (e.g., SMP2 and SMP3) can correspond to the candidate sequences (e.g., sqn_sel2 and sqn_sel3), such as configured independently in the form of register fields shown in FIG. 3*a*, such that the first and second sampling times (e.g., SMP2 and SMP3) can be set as the same or different. In this example, the multiplexing unit U2 can be directly electrically coupled to the conversion module M2 to send the selected sampling time to the conversion module M2, but not limited to the description here.

In an example, as shown in FIGS. 1 and 2, the timing-control module M1 can further include a temporary storage unit U3. For example, the temporary storage unit U3 can be a multi-bit (such as 10-bits) time register (SMPTx). The temporary storage unit U3 is electrically coupled to the multiplexing unit U2 and the conversion module M2. The temporary storage unit U3 is configured to temporarily store one of the sampling times within a predetermined period and then output the sampling time to the conversion module M2, such that the conversion module M2 converts the analog signal into a digital signal according to the sampling time. In one example, in response to a completion of conversion from the analog signal to the digital signal, the conversion module M2 can output a completion flag (EOC) to the sequence setting unit U1. For example, the completion flag (EOC) can be a single pulse wave, such as a high-level pulse wave, but not limited to the description here. It should be understood that the completion flag (EOC) can be a flag indicating that a conversion of a single sequence is completed or a flag indicating that all sequences have been converted. A type of flag to which the completion flag (EOC) belongs can be configured according to the actual application.

For example, as shown in FIGS. 1 and 2, sixteen sequences outputted are taken as an example. The sequence setting unit U1 can output one of the candidate sequences sqn_sel0, sqn_sel1, sqn_sel2, . . . , and sqn_sel15 to control the multiplexing unit U2 to select one of the corresponding candidate sampling times SMP0, SMP1, SMP2, . . . , SMP15. When a system is initialized, the conversion module M2 can be scheduled to generate a completion flag (EOC), such that the sequence setting unit U1 inputs a first sequence number (such as 10'd0) to the multiplexing unit U2, such that the multiplexing unit U2 selects to output the candidate sampling time SMP0 to the temporary storage unit U3. The temporary storage unit U3 can temporarily keep outputting the candidate sampling time SMP0 to the conversion module M2 as the first sampling time, such that the conversion module M2 performs processes of sampling and converting on the inputted analog signal IN according to the first sampling time. After completing the conversion, the conversion module M2 can generate another completion flag (EOC). Subsequently, the sequence setting unit U1 inputs a second sequence number (such as 10'd1) to the multiplexing unit U2, such that the multiplexing unit U2 selects to output the candidate sampling time SMP1 to the temporary storage unit U3. The temporary storage unit U3 can temporarily keep outputting the candidate sampling time SMP1 to the conversion module M2 as the second sampling time, such that the conversion module M2 performs processes of sampling and converting on the inputted analog signal IN according to the second sampling time. After completing the conversion, the conversion module M2 can generate another completion flag (EOC). In this way, the sequence setting unit U1 sequentially inputs the selected sequence numbers, such as the third, . . . , and tenth sequence numbers (such as 10'd2, . . . , 10'd9) to the multiplexing unit U2, such that the multiplexing unit U2 respectively selects to output the candidate sampling times SMP2, . . . , SMP9 to the temporary storage unit U3. The temporary storage unit U3 can temporarily keep outputting the candidate sampling times SMP2, . . . SMP9 to the conversion module M2 to be as the third, . . . , and tenth sampling times, respectively, such that the conversion module M2 sequentially performs processes of sampling and converting on the inputted analog signal IN according to the third, . . . , tenth sampling times, but not limited to the description here. In other words, if how many candidate sequences are sequentially selected by the sequence setting unit U1, then how many candidate sampling times are sequentially outputted by the multiplexing unit U2 as the sampling time for the ADC conversion performed by the conversion module M2.

Alternatively, in another example, as shown in FIGS. 1 and 2, the timing-control module M1 can also be configured as a finite state machine. For example, multiple predetermined states are performed in sequence to output the sampling times of n (such as n=2~16) selected candidate sequences, taking n=10 as an example, the 0th, 1st, 2nd, 3rd, . . . , and 9th sampling time t0, t1, t2, t3, . . . , and t9 are outputted in sequence, but not limited to the description here.

Figure 4:
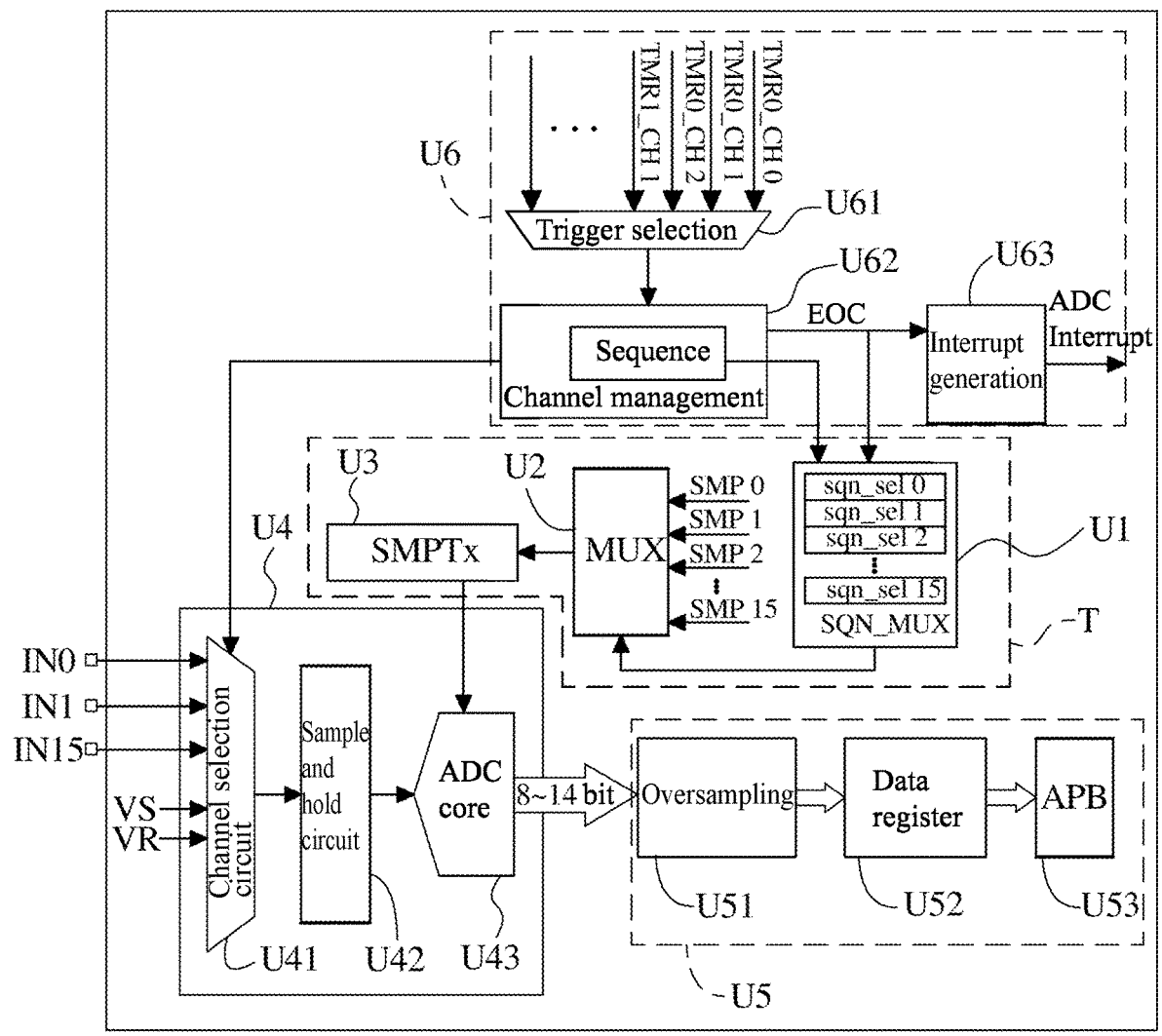
FIG. 4 is a block diagram illustrating an application circuit of an analog-to-digital converter according to an embodiment of the present disclosure.

In another aspect, as shown in FIGS. 1, 2, and 4, the conversion module M2 can realize a function of analog-to-digital conversion, e.g., the conversion module M2 includes a plurality of functional units U4, U5 and U6, but not limited to the description here.

For example, as shown in FIGS. 1, 2, and 4, the conversion module M2 may include a core functional unit U4, e.g., that includes a channel selection circuit U41, a sample-and-hold circuit U42, and an analog-to-digital conversion circuit U43. The channel selection circuit U41 is configured to select the same sampling channel (such as IN0, but not limited to the description here) among a plurality of sampling channels (such as IN0, IN1, . . . , and IN15) to obtain an analog signal (such as IN shown in FIGS. 1 and 2). For example, the channel selection circuit U41 can be a multiplexing circuit, e.g., that adopts control signals VS and VR as a selection signal and an enable signal; the channel selection circuit U41 is electrically coupled to the plurality of sampling channels; the channel selection circuit U41 is configured to select the same sampling channel of the plurality of sampling channels. For example, the sampling channel can be configured as a default channel of the plurality of sampling channels or a user-determined channel of the plurality of sampling channels. For example, please refer to FIGS. 3a and 4 together, the channel selection circuit U41 can select the sampling channel based on the sampling channel number configured by the sampling-channel register field B[4:0] corresponding to each of the plurality of candidate sequences selected by the channel management circuit U62. The sample-and-hold circuit U42 is configured to obtain the analog signal from the same sampling channel according to the first and second sampling times. For example, the sample-and-hold circuit U42 includes a sampling switch (e.g., the sampling switch can be realized by such as a complementary metal oxide semiconductor (CMOS) switch or a bootstrapped switch) and a sampling capacitor (such as a multi-layer plate capacitor), the sampling capacitor is electrically coupled to the sampling switch, the sampling switch is configured to couple the sampling channel and the sampling capacitor according to the first sampling time and the second sampling time. For example, at different sampling times, the time that the analog signal IN from the selected sampling channel is inputted to the sampling capacitor is different. The analog-to-digital conversion circuit U43 is configured to convert the analog signal into the digital signal. For example, the analog-to-digital conversion circuit U43 includes an analog-to-digital conversion (ADC) core circuit for converting analog signals into digital signals, but not limited to the description here. It is worth taking note that the present disclosure does not limit the operating principle of analog-to-digital conversion of the analog-to-digital conversion circuit U43, which can be a direct conversion analog-to-digital converter (i.e., direct-conversion ADC, or called flash ADC), successive approximation analog-to-digital converter (i.e., successive approximation ADC), or sigma-delta analog-to-digital converter (i.e., sigma-delta ADC), and the like.

In one example, as shown in FIGS. 1, 2, and 4, the conversion module M2 may further include an output-function unit U5, e.g., that includes an oversampling circuit U51, a data register U52, and an data bus (such as an advanced peripheral bus, APB) U53. The oversampling circuit U51 is electrically coupled to the analog-to-digital conversion circuit U43. The data register U52 is electrically coupled to the oversampling circuit U51 and the data bus U53. For example, the oversampling circuit U51 can be a clock data recovery circuit (CDR) based on the oversampling technology. The digital signal outputted by the analog-to-digital conversion circuit U43 can be further processed in an oversampling process by the oversampling circuit U51, and then data that is processed in the oversampling process can be temporarily stored in the data register U52, so as to be subsequently output via the data bus U53 and used as the basis for other electronic control devices (such as controllers) to make control determinations. In one example, the oversampling circuit U51 can be applied to temperature sensor circuits, e.g., when temperature information is collected, oversampling can be used, but is not limited to the description here.

In an example, as shown in FIGS. 1, 2, and 4, the conversion module M2 may further include a management function unit U6, e.g., that includes a trigger selection circuit U61, a channel management circuit U62, and an interrupt generation circuit U63. The selection circuit U61 can select one of a plurality of triggering signals (such as triggering signals TMR0_CH0, TMR0_CH1, TMR0_CH2, TMR1_CH1, . . . , and other triggering signals from different timers) to the channel management circuit U62. The present disclosure is not limited to the description here, e.g., other triggering signals may further include signals used for triggering the analog-to-digital conversion function of the conversion module M2. The channel management circuit U62 is electrically coupled to the trigger selection circuit U61, the interrupt generation circuit U63, and the sequence setting unit U1 of the timing-control module M1. The channel management circuit U62 can be configured to set the sampling-channel register field (such as the field B[4:0] shown in FIG. 3a) and the sampling-time register field (such as the field C[9:0] shown in FIG. 3a) corresponding to each selected candidate sequence according to the plurality of triggering signals, to write the sequence memory of the sequence setting unit U1. In one embodiment, the channel management circuit U62 is further configured to generate the completion flag (EOC) after the ADC conversion of all of the candidate sequences corresponding to the present triggering signal is completed, and the completion flag (EOC) can also be used to make the interrupt generation circuit U63 generate an ADC interrupt signal.

For example, the conversion module M2 of the analog-to-digital converter can be operated in various operation modes, such as a single operation mode, a continuous operation mode, a scanning operation mode, and an intermittent conversion mode. In different modes, a first pulse signal on a triggering signal selected by the trigger selection circuit U61 (e.g., the level is sequentially changed as logic 0, logic 1, logic 0, . . . ) triggers a set of sequences of ADC conversions for starting an operation mode (wherein the set of sequences includes multiple selected candidate sequences, the sequence length can be a value less than the number of sampling channels). Then, a second pulse signal on the completion flag (EOC) (e.g., the level is sequentially changed as logic 0, logic 1, logic 0, . . . ) to be a flag for finishing the operation mode (e.g., as a sequence completion flag). In addition, the operation mode may include sampling and converting processes for at least one channel.

It should be understood that the conversion module in the embodiments of the present disclosure can be applied to mode-adopting scenarios for the same sampling channel and different sampling times, but not limited to the description here, the conversion module of the embodiments of the present disclosure can also be applied to mode-adopting scenarios for different sampling channels and different sampling time. Examples are provided as follows.

In one example, the single operation mode is taken as an example, a pulse wave is used as a triggering signal, and after a single sampling and analog-to-digital conversion process for the sampling channel is performed, a pulse wave is used as a completion flag (EOC).

In one example, the scanning operation mode is taken as an example, a pulse wave is used as a triggering signal, and after multiple sampling and analog-to-digital conversion processes for the sampling channel are performed, a pulse wave is used as a completion flag (EOC), in which the number of sampling and analog-to-digital conversion processes is determined by using the sequence length (e.g., A[3:0]+1 in the embodiment regarding FIG. 3).

Figure 5:
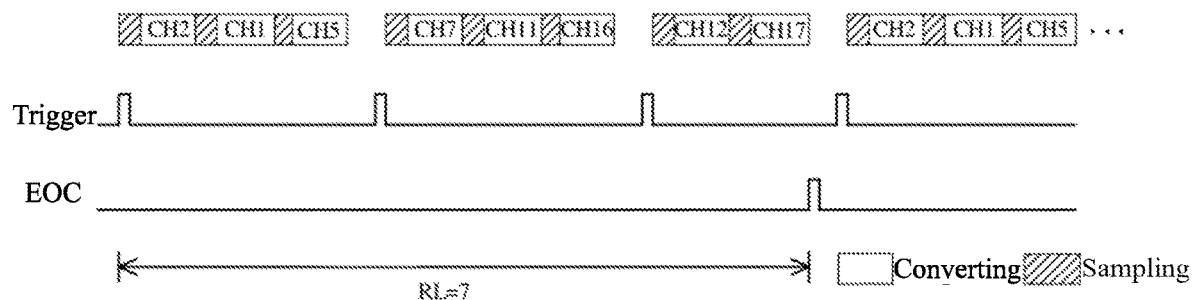
FIG. 5 is a schematic diagram illustrating an analog-to-digital conversion mode according to an embodiment of the present disclosure.

In one example, the intermittent operation mode is taken as an example, as shown in FIG. 5, the sequence length RL=7 (RL can correspond to the reference value in the sequence length field A[3:0] in the embodiment shown in FIG. 3a). In the intermittent mode, a complete sequence of ADC conversion can be triggered by using multiple triggering signals. After each of the multiple triggering signals is used for triggering, multiple sampling and converting processes for multiple channels are performed. For example, the sequence length shown in FIG. 5 is A[3:0]+1=8. Namely, there is a process of sampling channels corresponding to eight candidate sequences to be successively sampled and converted, including a first pulse wave signal used as the triggering signal, followed by sampling and converting processes for three channels CH2, CH1, CH5, then a second pulse signal used as the triggering signal, followed by sampling and converting processes for three channels CH7, CH11, and CH16, and then a third pulse signal used as the triggering signal, followed by sampling and converting processes for two channels CH12 and CH17. After the sampling and converting process for channel CH17 is completed, a pulse wave EOC is generated as the completion flag for all eight candidate sequences. Subsequently, the aforementioned process can be repeated. For example, a fourth pulse wave signal is used as a triggering signal, followed by sampling and converting processes for three channels CH2, CH1, and CH5, which can be understood in reference to the above description.

Figure 6:
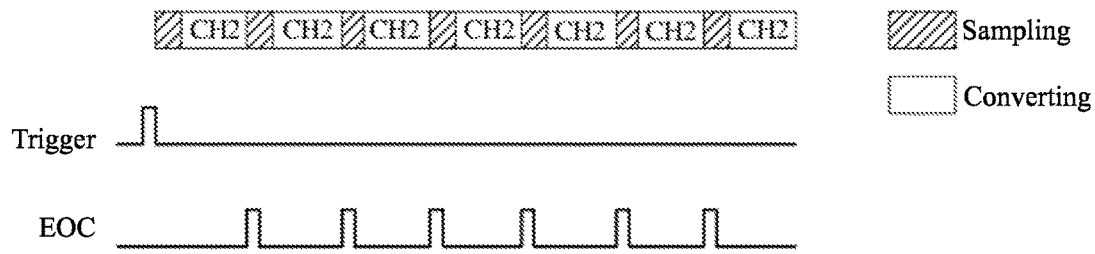
FIG. 6 is a schematic diagram illustrating another analog-to-digital conversion mode according to an embodiment of the present disclosure.

In one example, the continuous operation mode is taken as an example, as shown in FIG. 6, a pulse wave is used as a triggering signal, and multiple sampling and analog-to-digital conversion processes for a single channel are performed. For example, the number of multiple sampling and analog-to-digital conversion processes can be determined by using the sequence length (such as A[3:0]+1 in the embodiment regarding FIG. 3). For example, at present, if A[3:0]=6, then the sequence length is seven, i.e., sampling and converting processes of the same channel CH2 are sequentially performed according to an order defined by seven candidate sequences. After each conversion process for a single channel is completed, a pulse wave EOC is generated as a completion flag. For example, after a first, second, third, fourth, fifth, sixth, and . . . conversion process for the second channel CH2 is completed, a pulse wave regarding a completion flag is generated, respectively.

For example, application scenarios of the embodiments mentioned above are illustrated to make the relationship between the analog signal and the sampling time easily understood. Still, it is not intended to limit the present disclosure. In one example, a sinusoidal wave is used as the analog signal, but it is not limited to the description here. The analog signal can also be other continuous signals, such as triangular or sawtooth waves. For example, at a specific point in time, a relationship between absolute values of the analog signal and sampling times of corresponding candidate sequences is set to be negatively correlated. For example, the analog signal has at least one extremum and at least one non-extremum in a single cycle, wherein the extremum, the sampling time of the sequence corresponding to the extremum is shorter than the sampling time of the sequence corresponding to the non-extremum.

Figure 7:
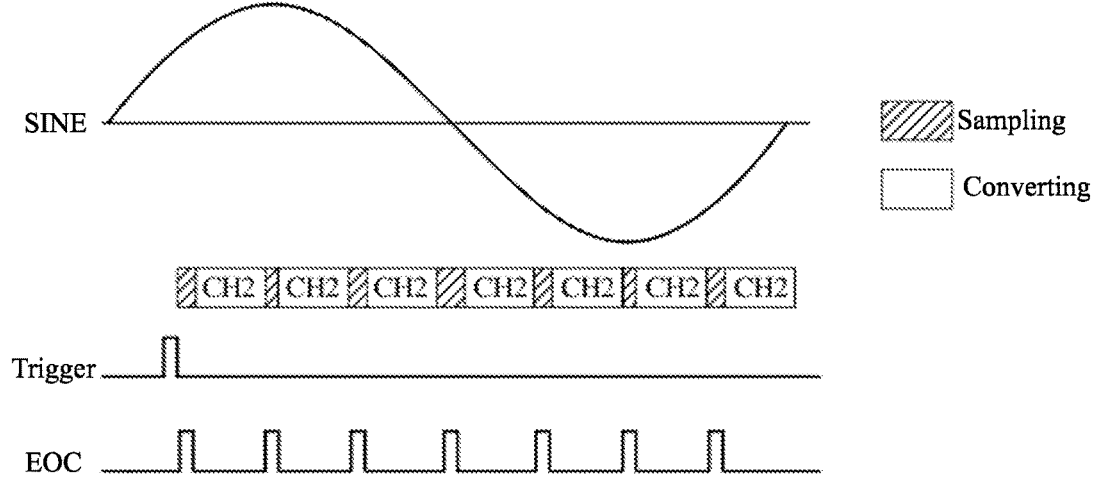
FIG. 7 is a schematic diagram illustrating a relationship between an analog signal and a sampling time according to an embodiment of the present disclosure.

In an example, illustrated as shown in FIG. 7, as the signal waveform changes, sampling times can be set to be different, but conversion times remain unchanged. For example, during a single cycle, a signal value of a sinusoidal waveform (marked as "SINE" shown in the figure) rises from 0 to a peak (i.e., a first extremum of the sinusoidal waveform SINE), then the signal value drops from the peak to 0 (i.e., at a zero crossing point of the sinusoidal waveform SINE), then the signal value continues to drop to a trough (i.e., a second extremum of the sinusoidal waveform SINE), and then the signal value rises to 0. The continuous operation mode is an example. Seven sequences are configured to be used in the same sampling channel (such as channel CH2). In seven sampling and analog-to-digital conversion processes for the channel CH2, a configuration can be set as follows: each of the second and the sixth sampling times for the channel CH2 is the shortest (corresponding to the first and second extremums of the sinusoidal waveform SINE), each of the first, third, fifth, and seventh sampling times for the channel CH2 is the runner-up (corresponding to the non-extremums and non-zero crossing points of the sinusoidal waveform SINE), and the fourth sampling time for the channel CH2 is the most extended (corresponding to the zero crossing point of the sinusoidal waveform SINE).

As mentioned above, as shown in FIGS. 1 and 2, the analog-to-digital converter provided by an embodiment of the present disclosure includes: a channel module M0 that includes a plurality of sampling channels, wherein each of the plurality of sampling channels is configured to receive an analog signal IN; a timing-control module M1 that is configured to provide a plurality of candidate sequences for the same sampling channel among the plurality of sampling channels, wherein the plurality of candidate sequences include a first sequence and a second sequence, and the timing-control module M1 sets a first sampling time corresponding to the first sequence and sets a second sampling time corresponding to the second sequence; and a conversion module M2 that is electrically coupled to the timing-control module M1 and the channel module M0, wherein the conversion module M2 is configured to convert the analog signal IN from the same sampling channel into a digital signal in response to an order and sampling times that are defined by the plurality of candidate sequences. Therefore, by having the same sampling channel to have different sampling times for different sequences, it is possible to realize that sampling processes with different densities are adapted at different points in time for a sampling signal, such that a sampling time scheme of all the sampling processes is more flexible, and sampling results are more accurate and reliable. In such a way, it is conducive to maximizing sampling effectiveness, sampling accuracy, and flexibility.

Optionally, in one embodiment, as shown in FIGS. 1 and 2, the timing-control module M1 includes a sequence setting unit U1 that is electrically coupled to the conversion module M2 and is configured to select the plurality of candidate sequences sequentially; the order regarding the plurality of candidate sequences is defined to be an order of operations in which the conversion module converts the analog signal into the digital signal. Each of the candidate sequences corresponds to one of the plurality of the sampling channels. Therefore, by setting multiple candidate sampling times for the same sampling channel through multiple candidate sequences, an analog-to-digital conversion scheme with non-equal sampling times is realized. In such a way, it is conducive to maximizing sampling effectiveness, sampling accuracy, and flexibility.

Optionally, in an embodiment, each of the plurality of candidate sequences corresponds to one of a plurality of candidate sampling times, wherein the first sequence corresponds to the first sampling time, the second sequence corresponds to the second sampling time, each of the plurality of candidate sampling times is set as one of a plurality of time values, and a difference between adjacent two of the plurality of time values is one clock cycle. Therefore, by using multiple time values in which any two of the time values differ by one clock cycle, the settable number of the candidate sampling times can be increased, and the effect of continuous and configurable time can be realized more intuitively. In such a way, it is conducive to maximizing sampling effectiveness, sampling accuracy, and flexibility.

Optionally, in an embodiment, as shown in FIGS. 1 and 2, the conversion module M2 outputs a completion flag to the sequence setting unit U1 in response to a completion of conversion from the analog signal to the digital signal. Therefore, by the completion flag, the sampling and converting process of the present sequence can be completed to perform the sampling and converting process of the following sequence, such that a sequence control mechanism is simplified. In such a way, it is conducive to maximizing sampling effectiveness, sampling accuracy, and flexibility.

Optionally, in an embodiment, as shown in FIGS. 1 and 2, the timing-control module M1 includes a multiplexing unit U2 that is electrically coupled to the sequence setting unit U1, wherein the multiplexing unit U2 is configured to select one of a plurality of candidate sampling times to generate one of the sampling times according to one of the plurality of candidate sequences selected by the sequence setting unit U1, wherein the first sampling time is correspondingly selected to generate one of the sampling times if the first sequence is selected, and the second sampling time is correspondingly selected to generate one of the sampling times if the second sequence is selected. Therefore, circuit complexity and delay are reduced by using the multiplexing unit with a simple structure as a sampling time selection scheme. In such a way, it is conducive to maximizing sampling effectiveness, sampling accuracy, and flexibility.

Optionally, in an embodiment, as shown in FIGS. 1 and 2, the timing-control module M1 includes a temporary storage unit U3 that is electrically coupled to the multiplexing unit U2 and the conversion module M2, wherein the temporary storage unit U3 is configured to store one of the sampling times for a predetermined period temporarily. Therefore, by the temporary storage unit, a single sampling time is maintained in a single sequence, and a signal sampling process of unequal time is stably performed. In such a way, it is conducive to maximizing sampling effectiveness, sampling accuracy, and flexibility.

Optionally, in an embodiment, each of the plurality of candidate sequences has a corresponding sampling-channel register field that stores the sampling channel corresponding to each of the plurality of candidate sequences, and each of the plurality of candidate sequences has a corresponding sampling-time register field that stores the sampling time corresponding to each of the plurality of candidate sequences. Therefore, the sampling channel corresponding to each candidate sequence and the sampling time corresponding to each candidate sequence are stored in the fields involving each candidate sequence, which can be used to apply the sampling time to the signal of the sampling channel for sampling. Thus, it is beneficial to achieve sampling effectiveness.

Optionally, in an embodiment, as shown in FIGS. 1, 2, and 4, the first sampling time and the second sampling time are different. Therefore, the signal conversion situation where the sampling time needs to be fine-tuned can be applied by the first and second sampling times with different durations. In such a way, it is conducive to maximizing sampling effectiveness, sampling accuracy, and flexibility.

Optionally, in one embodiment, as shown in FIGS. 1, 2, and 4, the conversion module M2 includes a channel selection circuit U41, a sample-and-hold circuit U42, and an analog-to-digital conversion circuit U43, wherein the channel selection circuit U41 is electrically coupled to the plurality of sampling channels and configured to select the same sampling channel among the plurality of sampling channels, the sample-and-hold circuit U42 is configured to respectively sample the analog signal IN from the same sampling channel according to the first sampling time and the second sampling time, and the analog-to-digital conversion circuit U43 is configured to convert the analog signal into the digital signal. Therefore, the sample-and-hold circuit is configured to obtain the analog signal from the sampling channel according to the sampling time of the corresponding sequence, effectively responding to the characteristics of the analog signal to perform sampling. In such a way, it is conducive to maximizing sampling effectiveness, sampling accuracy, and flexibility.

Optionally, in one embodiment, as shown in FIG. 4, the sample-and-hold circuit U42 includes a sampling switch and a sampling capacitor, wherein the sampling capacitor is electrically coupled to the sampling switch, and the sampling switch is configured to couple the sampling channel to the sampling capacitor according to the first sampling time and the second sampling time, respectively. Therefore, the sampling switch is configured to couple the sampling channel and the sampling capacitor according to the first and second sampling times to effectively receive an analog signal for sampling. In such a way, it is conducive to maximizing sampling effectiveness, sampling accuracy, and flexibility.

In another aspect, an embodiment of the present disclosure also provides a signal conversion device. For example, the signal conversion device includes: a controller and the above-mentioned analog-to-digital converter, the controller is electrically coupled to the analog-to-digital converter. For example, an analog signal for the analog-to-digital converter can come from a specific analog signal source, e.g., an output signal of a sensor. The controller can send or transfer related signals to the analog-to-digital converter (as shown in FIG. 4, such as signals VS, VR, TMR0_CH0, TMR0_CH1, TMR0_CH2, TMR1_CH1, . . . ), as the basis for driving the analog-to-digital converter to perform an analog-to-digital signal conversion process.

In another aspect, an embodiment of the present disclosure also provides a signal conversion method, including a non-equal-length sampling and converting step, e.g., as shown in FIGS. 1 and 2, driving, by a processor executing instructions stored in a memory electrically coupled to the processor such as being electrically coupled to the analog-to-digital converter, the analog-to-digital converter T as mentioned above to be configured for: receiving an analog signal from each of a plurality of sampling channels; providing a plurality of candidate sequences for the same sampling channel among the plurality of sampling channels, wherein the plurality of candidate sequences comprise a first sequence and a second sequence, and the timing-control module sets a first sampling time corresponding to the first sequence and a second sampling time corresponding to the second sequence; and converting the analog signal from the same sampling channel to a digital signal in response to an order and sampling times defined by the plurality of candidate sequences.

Optionally, the technology for configuring the sampling time for the sequences disclosed in the present disclosure can be applied to various application scenarios. In one embodiment, at a specific point in time, the sampling time corresponding to one of the plurality of candidate sequences is set to be negatively correlated with an absolute value of the analog signal. Therefore, the analog signal can be sampled more densely (such as having the shorter sampling time) in an interval with a larger value and less densely (such as having the longer sampling time) in an interval with a smaller value, such that different density in different regions of the signal to be sampled can be realized. In such a way, the whole sampling process is more flexible, and the results are more accurate and reliable.

Optionally, in an embodiment, a waveform of the analog signal has at least one extremum and at least one non-extremum in a single period, and the sampling time regarding a respective one of the plurality of sampling sequences corresponding to the extremum value is shorter than the sampling time regarding a respective one of the plurality of sampling sequences corresponding to the non-extremum. Therefore, the analog signal can be sampled densely (such as having a short sampling time) near the extremum of the waveform (such as a sine wave) and sampled sparsely (such as having a long sampling time) in other intervals, in which sampling with different densities in different regions of the signal to be sampled can be implemented. In such a way, the whole sampling process is more flexible, and the results are more accurate and reliable.

In summary, the analog-to-digital converter, signal conversion device, and method of the embodiments of the present disclosure, each of the plurality of sampling channels of the channel module is configured for: receiving the analog signal, wherein the plurality of candidate sequences are set for the same sampling channel among the plurality of sampling channels, the plurality of candidate sequences include the first sequence and the second sequence, and the timing-control module sets the first sampling time corresponding to the first sequence and sets the second sampling time corresponding to the second sequence; and converting the analog signal from the same sampling channel to the digital signal in response to the order and sampling times defined by the plurality of candidate sequences. Accordingly, it is possible to configure different sequences of sampling time for the same sampling channel. In one embodiment, a flexible configuration can be implemented according to the signal waveform of the analog signal from the sampling channel; different sampling times are used at different time points for the analog signal. For example, the relationship between the absolute value of the analog signal and the sampling time of the corresponding sequence is set to be negatively correlated at a specific point in time. The present disclosure can realize adjustable sampling intervals, further improving sampling effectiveness, sampling accuracy, and flexibility. Compared with the prior art that uses a single sampling channel matched with a single sampling time, the present disclosure can improve problems of poor sampling accuracy and limited sampling configuration and is conducive to improving the technical level and quality of the analog-to-digital converter.

In the embodiments above, the descriptions of different embodiment have their emphases. For parts not described in detail in a specific embodiment, reference may be made to relevant descriptions of other embodiments.

The embodiments of the present disclosure have been introduced in detail above, and the principles and implementation methods of the present disclosure have been described using specific examples herein. The descriptions of the above embodiments are only used to help understand the technical solutions and core ideas of the present disclosure; The skilled person should understand that it is still possible to modify the technical solutions described in the preceding embodiments or perform equivalent replacements for some of the technical features; these modifications or replacements do not make the essence of the corresponding technical solutions deviate from the scope of the various technical solutions of the present disclosure.

What is claimed is:

1. An analog-to-digital converter, comprising:
   a channel module comprising a plurality of sampling channels, wherein each of the plurality of sampling channels is configured to receive an analog signal;
   a timing-control module configured to provide a plurality of candidate sequences for a same sampling channel among the plurality of sampling channels, wherein the plurality of candidate sequences comprise a first sequence and a second sequence, and the timing-control module sets a first sampling time corresponding to the first sequence and sets a second sampling time corresponding to the second sequence; and
   a conversion module electrically coupled to the timing-control module and the channel module, wherein the conversion module is configured to convert the analog signal from the same sampling channel into a digital signal in response to an order and sampling times that are defined by the plurality of candidate sequences.

2. The analog-to-digital converter as claimed in claim 1, wherein the timing-control module comprises a sequence setting unit that is electrically coupled to the conversion module and is configured to select the plurality of candidate sequences sequentially, the order defined by the plurality of candidate sequences is an order of operations in which the conversion module converts the analog signal into the digital signal, and each of the candidate sequences corresponds to one of the plurality of the sampling channels.

3. The analog-to-digital converter as claimed in claim 2, wherein each of the plurality of candidate sequences corresponds to one of a plurality of candidate sampling times, wherein the first sequence corresponds to the first sampling time, the second sequence corresponds to the second sampling time, each of the plurality of candidate sampling times is set as one of a plurality of time values, and a difference between adjacent two of the plurality of time values is one clock cycle.

4. The analog-to-digital converter as claimed in claim 2, wherein the conversion module outputs a completion flag to the sequence setting unit in response to a completion of conversion from the analog signal to the digital signal.

5. The analog-to-digital converter as claimed in claim 2, wherein the timing-control module comprises a multiplexing unit that is electrically coupled to the sequence setting unit, the multiplexing unit is configured to select one of a plurality of candidate sampling times to generate one of the sampling times according to one of the plurality of candidate sequences selected by the sequence setting unit, the first sampling time is correspondingly selected to generate one of the sampling times when the first sequence is selected, and the second sampling time is correspondingly selected to generate one of the sampling times when the second sequence is selected.

6. The analog-to-digital converter as claimed in claim 5, wherein the timing-control module comprises a temporary storage unit that is electrically coupled to the multiplexing unit and the conversion module and configured to store one of the sampling times for a predetermined period temporarily.

7. The analog-to-digital converter as claimed in claim 2, wherein each of the plurality of candidate sequences has a corresponding sampling-channel register field that stores the sampling channel corresponding to each of the plurality of candidate sequences, and each of the plurality of candidate sequences has a corresponding sampling-time register field that stores the sampling time corresponding to each of the plurality of candidate sequences.

8. The analog-to-digital converter as claimed in claim 1, wherein the first sampling time and the second sampling time are different.

9. The analog-to-digital converter as claimed in claim 1, wherein the conversion module comprises a channel selection circuit, a sample-and-hold circuit, and an analog-to-digital conversion circuit, the channel selection circuit is electrically coupled to the plurality of sampling channels and configured to select the same sampling channel among the plurality of sampling channels, the sample-and-hold circuit is configured to respectively sample the analog signal from the same sampling channel according to the first sampling time and the second sampling time, and the analog-to-digital conversion circuit is configured to convert the analog signal into the digital signal.

10. The analog-to-digital converter as claimed in claim 9, wherein the sample-and-hold circuit comprises a sampling switch and a sampling capacitor, the sampling capacitor is electrically coupled to the sampling switch, and the sampling switch is configured to couple the sampling channel to the sampling capacitor according to the first sampling time and the second sampling time, respectively.

11. A signal conversion device, comprising: a controller and an analog-to-digital converter, wherein the controller is electrically coupled to the analog-to-digital converter, and wherein the analog-to-digital converter comprises:

a channel module comprising a plurality of sampling channels, wherein each of the plurality of sampling channels is configured to receive an analog signal;

a timing-control module configured to provide a plurality of candidate sequences for a same sampling channel among the plurality of sampling channels, wherein the plurality of candidate sequences comprise a first sequence and a second sequence, and the timing-control module sets a first sampling time corresponding to the first sequence and sets a second sampling time corresponding to the second sequence; and a conversion module electrically coupled to the timing-control module and the channel module, wherein the conversion module is configured to convert the analog signal from the same sampling channel into a digital signal in response to an order and sampling times that are defined by the plurality of candidate sequences.

12. The signal conversion device as claimed in claim 11, wherein the timing-control module comprises a sequence setting unit that is electrically coupled to the conversion module and is configured to select the plurality of candidate sequences sequentially, the order defined by the plurality of candidate sequences is an order of operations in which the conversion module converts the analog signal into the digital signal, and each of the candidate sequences corresponds to one of the plurality of the sampling channels.

13. The signal conversion device as claimed in claim 12, wherein each of the plurality of candidate sequences corresponds to one of a plurality of candidate sampling times, wherein the first sequence corresponds to the first sampling time, the second sequence corresponds to the second sampling time, each of the plurality of candidate sampling times is set as one of a plurality of time values, and a difference between adjacent two of the plurality of time values is one clock cycle.

14. The signal conversion device as claimed in claim 12, wherein the conversion module outputs a completion flag to the sequence setting unit in response to a completion of conversion from the analog signal to the digital signal.

15. The signal conversion device as claimed in claim 12, wherein the timing-control module comprises a multiplexing unit that is electrically coupled to the sequence setting unit, the multiplexing unit is configured to select one of a plurality of candidate sampling times to generate one of the sampling times according to one of the plurality of candidate sequences selected by the sequence setting unit, the first sampling time is correspondingly selected to generate one of the sampling times when the first sequence is selected, and the second sampling time is correspondingly selected to generate one of the sampling times when the second sequence is selected.

16. The signal conversion device as claimed in claim 12, wherein each of the plurality of candidate sequences has a corresponding sampling-channel register field that stores the sampling channel corresponding to each of the plurality of candidate sequences, and each of the plurality of candidate sequences has a corresponding sampling-time register field that stores the sampling time corresponding to each of the plurality of candidate sequences.

17. The signal conversion device as claimed in claim 11, wherein the first sampling time and the second sampling time are different.

18. A signal conversion method, comprising:

driving, by a processor executing instructions stored in a memory electrically coupled to the processor, an analog-to-digital converter, comprising a channel module, a timing-control module, and a conversion module electrically coupled to the timing-control module and the channel module, to be configured for:

receiving, by the channel module, an analog signal from each of a plurality of sampling channels;

providing, by the timing-control module, a plurality of candidate sequences for a same sampling channel among the plurality of sampling channels, wherein the plurality of candidate sequences comprise a first sequence and a second sequence, and the timing-control module sets a first sampling time corresponding to the first sequence and a second sampling time corresponding to the second sequence; and converting, by the conversion module, the analog signal from the same sampling channel to a digital signal in response to an order and sampling times defined by the plurality of candidate sequences.

19. The signal conversion method as claimed in claim 18, wherein at a specific point in time, the sampling time corresponding to one of the plurality of candidate sequences is set to be negatively correlated with an absolute value of the analog signal.

20. The signal conversion method as claimed in claim 19, wherein a waveform of the analog signal has at least one extremum and at least one non-extremum in a single period, and the sampling time regarding a respective one of the plurality of sampling sequences corresponding to the extremum value is shorter than the sampling time regarding a respective one of the plurality of sampling sequences corresponding to the non-extremum.

* * * * *